(12) United States Patent
Murr

(10) Patent No.: US 6,218,873 B1
(45) Date of Patent: Apr. 17, 2001

(54) DRIVER STAGE FOR SWITCHING A LOAD

(75) Inventor: Robert Murr, Barbing (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/539,234

(22) Filed: Mar. 30, 2000

(30) Foreign Application Priority Data

Mar. 30, 1999 (DE) .............................. 199 14 466

(51) Int. Cl.[7] .............................. H03B 1/00; H03K 3/00
(52) U.S. Cl. .................... 327/109; 327/205; 327/379
(58) Field of Search ........................ 327/108–112, 374, 327/376, 377, 378, 379, 205; 323/271, 277

(56) References Cited

U.S. PATENT DOCUMENTS

| 3,752,980 | * | 8/1973 | Dixon et al. | 327/109 |
| 3,822,386 | * | 7/1974 | Gontowski, Jr. | 327/379 |
| 4,791,313 | * | 12/1988 | Kuo et al. | 327/327 |
| 5,258,661 | * | 11/1993 | Banker et al. | 327/205 |
| 5,546,043 | * | 8/1996 | Pollmeier | 327/108 |
| 5,565,810 | * | 10/1996 | Hammel et al. | 327/108 |

FOREIGN PATENT DOCUMENTS

19600792A1    7/1997   (DE) .

* cited by examiner

*Primary Examiner*—Terry D. Cunningham
*Assistant Examiner*—Long Nguyen
(74) *Attorney, Agent, or Firm*—Herbert L. Lerner; Laurence A. Greenberg; Werner H. Stemer

(57) ABSTRACT

When a short-circuit transistor is switched on, an impedance of an emitter-collector path through a switching transistor in a driver stage becomes higher as a load current becomes greater, and the load current and power loss in the switching transistor thus become lower. This effect is increased by connecting a voltage divider in parallel with the emitter-collector path through the switching transistor, by a parallel transistor. When the switching transistor is switched off, the parallel transistor blocks the current path via the voltage divider and the load for undesirable residual currents.

2 Claims, 1 Drawing Sheet

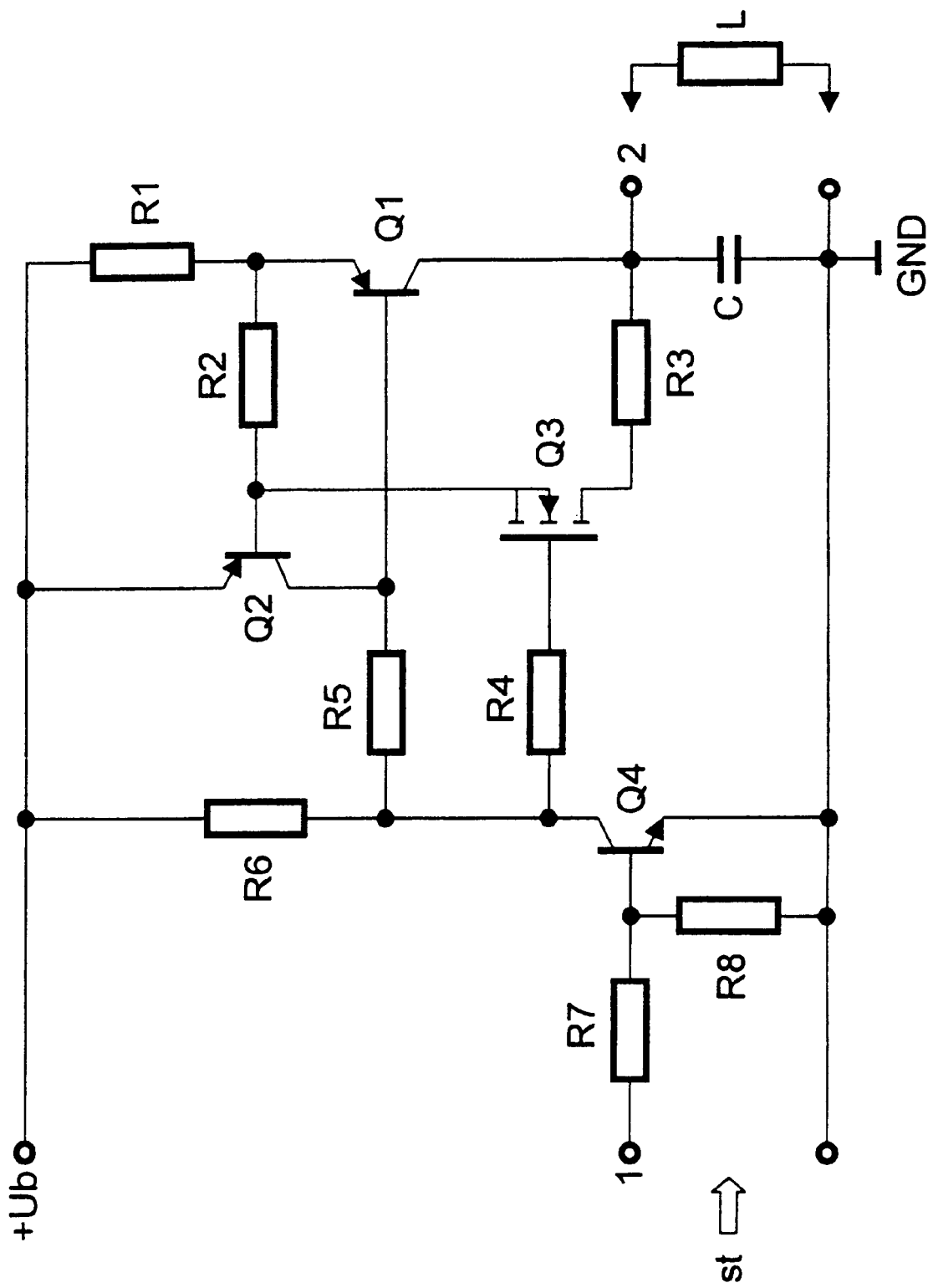

DRIVER STAGE FOR SWITCHING A LOAD

BACKGROUND OF THE INVENTION

Field of the Invention

The invention relates to a driver stage for switching a load. A typical driver stage is disclosed in Published, Non-Prosecuted German Patent Application DE 196 00 792 A1. Such driver stages are widely used, for example in motor vehicles, for switching small and medium-sized loads, such as light-emitting diodes, small motors, relays etc.

In the known driver stage, a voltage divider containing two resistors is connected in parallel with the switching path of a switching transistor which is connected in series with the load and via which a current flows, by which a current flowing through the switching transistor is reduced in the event of a short circuit. When the driver stage is switched off, a residual current flows from a positive pole of an operating voltage, via a series circuit containing the voltage divider and the load, to a negative pole.

SUMMARY OF THE INVENTION

It is accordingly an object of the invention to provide a driver stage for switching a load which overcomes the above-mentioned disadvantages of the prior art devices of this general type, in which if the driver stage is switched off, no superfluous residual current can flow from the positive pole through the load to the negative pole.

With the foregoing and other objects in view there is provided, in accordance with the invention, a driver stage for switching a load, including:
- a first pole terminal to be connected to a voltage source supplying an operating voltage and to the load and a second pole terminal to be connected to the voltage source supplying the operating voltage;
- a first resistor connected to the second pole terminal;
- a switching transistor having a collector, a base and an emitter connected to the first resistor, the collector to be connected to the load, and the first resistor, the switching transistor and the load defining a series circuit connected between the first pole terminal and the second pole terminal;
- a second resistor, a third resistor, a fourth resistor, a fifth resistor, and a sixth resistor connected to the second pole terminal;
- a driver transistor having an emitter connected to the first pole terminal, a base, and a collector connected first via the sixth resistor to the second pole terminal and second via the fifth resistor to the base of the switching transistor, the base of the driver transistor to receive a control signal for switching the switching transistor;
- a short-circuit transistor having an emitter connected to the second pole terminal, a collector connected to the base of the switching transistor, and a base connected via the second resistor to the emitter of the switching transistor and via the third resistor to the collector of the switching transistor; and
- a parallel transistor controllable in synchronism with the switching transistor by the driver transistor via the fourth resistor and having a switching path connected between the base of the short-circuit transistor and the third resistor.

In accordance with a concomitant feature of the invention, if the switching transistor is switched off, the parallel transistor blocks a path formed of the first resistor, the second resistor, the third resistor and the load, to an undesirable residual current.

Other features which are considered as characteristic for the invention are set forth in the appended claims.

Although the invention is illustrated and described herein as embodied in a driver stage for switching a load, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a circuit diagram of a short-circuit-resistant driver stage for switching a load according to the invention.

DESCRIPTION OF THE PREFERRED EMBODIMENTS

Referring now to the single figure of the drawing in detail, there is shown a short-circuit-resistant driver stage for switching a load. The driver stage has a pnp switching transistor Q1 whose emitter is connected via a first resistor R1 to a positive pole +Ub of an operating voltage source, and whose collector, which is an output 2 of the driver stage, is connected via a capacitor C to a negative pole GND of the operating voltage source.

A base of the switching transistor Q1 is likewise connected to the positive pole +Ub of the operating voltage source, via a series circuit containing a fifth resistor R5 and a sixth resistor R6. A junction point between the two resistors R5 and R6 is connected to a collector of an npn driver transistor Q4, whose emitter is connected to the negative pole GND of the operating voltage source.

Control signals st for switching the driver stage are supplied at an input 1 to a base of the driver transistor Q4 via a seventh resistor R7, which forms a voltage divider together with an eighth resistor R8, which is connected between a base and emitter of the driver transistor Q4.

A pnp short-circuit transistor Q2 is also provided, whose emitter is connected to the positive pole +Ub of the operating voltage source, whose collector is connected to the base of the switching transistor Q1, and whose base is connected via a second resistor R2 to the emitter of the switching transistor Q1.

Finally, a parallel transistor Q3 in the form of a P-channel MOSFET is also provided, whose source is connected to the base of the short-circuit transistor Q2, whose gate is connected via a fourth resistor R4 to the collector of the driver transistor Q4, and whose drain is connected via a third resistor R3 to the collector of the switching transistor Q1.

The circuit described above operates as now described. In normal operation, the control signal st (a logic high signal) at the input 1 switches the driver transistor Q4 on via the voltage divider R7, R8, and thus also switches the switching transistor Q1 on, via the resistor R5. A load current flows from the positive pole +Ub via the resistor R1, the switching transistor Q1 and the output 2 through a load L to the negative pole GND. A magnitude of the resistor R1 must be such that, in normal operation, the voltage drop across it is less than the base-emitter voltage required to switch the short-circuit transistor Q2 on.

At the same time that the switching transistor Q1 is switched on by the driver transistor Q4, the parallel transistor Q3 is also switched on, and connects a voltage divider, formed of the resistors R2 and R3, in parallel with the collector-emitter path through the switching transistor Q1. As long as the switching transistor Q1 is switched on, only a negligibly small current flows via the voltage divider.

If the load current now rises sufficiently for the voltage drop across the resistor R1 to reach the required base-emitter voltage of the short-circuit transistor Q2, then the transistor Q2 switches on and, via its emitter-collector path, draws so much base current from the switching transistor Q1 that the voltage across the resistor R1 does not rise above the base-emitter voltage (approximately 0.7 V) of the short-circuit transistor Q2. The load current flowing through the switching transistor Q1 is thus limited, in consequence protecting the switching transistor Q1 against short circuits.

When base current is drawn from the switching transistor Q1, then the impedance of its emitter-collector path can become so high that a voltage that is present across it rises virtually to the operating voltage Ub, as a result of which the voltage applied to the load L lapses.

The voltage across the emitter-collector path of the switching transistor Q1 is also present across the voltage divider R2, R3, which results in that the voltage across the resistor R2 is added to the voltage across the resistor R1. The sum of these two voltages once again corresponds to the base-emitter voltage of the short-circuit transistor Q2, which is approximately constant.

The voltage drop across the resistor R1 is thus reduced further and, with it, also the current through the switching transistor Q1, whose power loss likewise becomes smaller. The driver stage is thus reliably protected against short circuits and thermal overloading.

When the control signal st disappears, the base current is drawn from all four transistors, so that they are switched off.

The parallel transistor Q3 is used to avoid any residual current flowing via the resistors R1, R2 and R3 also flowing through the load L when the driver stage is switched off, since the parallel transistor Q3 disconnects the voltage divider R2, R3 when switched off.

The resistor R4 reduces a switching speed of the parallel transistor Q3; while the capacitor C is used to protect the driver stage against electric static discharge (ESD) pulses and against interference inputs from the exterior.

The described driver stage also operates in the inverse manner with transistors Q1 and Q2 as npn transistors, Q4 as a pnp transistor, and Q3 as an N-channel MOSFET. Any of the four transistors Q1 to Q4 may be in the form of a bipolar transistor or a MOSFET.

I claim:

1. A driver stage for switching a load, comprising:
   a first pole terminal to be connected to a voltage source supplying an operating voltage and to the load;
   a second pole terminal to be connected to the voltage source supplying the operating voltage;
   a first resistor connected to said second pole terminal;
   a switching transistor having a collector, a base and an emitter connected to said first resistor, said collector to be connected to the load, and said first resistor, said switching transistor and the load defining a series circuit connected between said first pole terminal and said second pole terminal;
   a second resistor;
   a third resistor;
   a fourth resistor;
   a fifth resistor;
   a sixth resistor connected to the second pole terminal;
   a driver transistor having an emitter connected to said first pole terminal, a base, and a collector connected first via said sixth resistor to said second pole terminal and second via said fifth resistor to said base of said switching transistor, said base of said driver transistor to receive a control signal for switching said switching transistor;
   a short-circuit transistor having an emitter connected to the second pole terminal, a collector connected to said base of said switching transistor, and a base connected via said second resistor to said emitter of said switching transistor and via said third resistor to said collector of said switching transistor; and
   a parallel transistor controllable in synchronism with said switching transistor by said driver transistor via said fourth resistor and having a switching path connected between said base of said short-circuit transistor and said third resistor.

2. The driver stage according to claim 1, wherein if said switching transistor is switched off, said parallel transistor blocks a path formed of said first resistor, said second resistor, said third resistor and the load, to an undesirable residual current.

* * * * *